US006807613B1

(12) United States Patent
Keeth et al.

(10) Patent No.: US 6,807,613 B1
(45) Date of Patent: Oct. 19, 2004

(54) SYNCHRONIZED WRITE DATA ON A HIGH SPEED MEMORY BUS

(75) Inventors: Brent Keeth, Boise, ID (US); Brian Johnson, Boise, ID (US)

(73) Assignee: Mircon Technology, Inc., Boise, ID (US)

( * ) Notice: Subject to any disclaimer, the term of this patent is extended or adjusted under 35 U.S.C. 154(b) by 644 days.

(21) Appl. No.: 09/641,516

(22) Filed: Aug. 21, 2000

(51) Int. Cl.$^7$ .............................. G06F 12/06; G06F 5/06
(52) U.S. Cl. .................. 711/167; 365/233; 365/189.05; 713/400
(58) Field of Search ............................... 711/167, 105, 711/169, 6; 365/233, 189.05, 189.01, 193, 203, 230.08, 230.03, 233.5; 713/400; 714/744

(56) References Cited

U.S. PATENT DOCUMENTS

| 6,003,118 | A | * | 12/1999 | Chen ........................... 711/167 |
| 6,021,264 | A | * | 2/2000 | Morita ......................... 713/401 |
| 6,064,625 | A | | 5/2000 | Tomita |
| 6,115,322 | A | * | 9/2000 | Kanda et al. ................. 365/233 |
| 6,151,270 | A | * | 11/2000 | Jeong ........................... 365/233 |
| 6,185,151 | B1 | * | 2/2001 | Cho ............................. 365/233 |
| 6,292,428 | B1 | * | 9/2001 | Tomita et al. ................. 365/233 |
| 6,339,552 | B1 | * | 1/2002 | Taruishi et al. ............... 365/189.05 |
| 6,427,197 | B1 | * | 7/2002 | Sato et al. ..................... 711/169 |

FOREIGN PATENT DOCUMENTS

| DE | 198 34 190 A 1 | 2/1999 | |
| EP | 0440191 | 7/1991 | |
| EP | 0 768 600 A1 | * 10/1996 | ............. G06F/5/06 |
| JP | 2000 156082 | 6/2000 | |

* cited by examiner

*Primary Examiner*—Pierre Bataille
(74) *Attorney, Agent, or Firm*—Dickstein Shapiro Morin & Oshinsky LLP (57) ABSTRACT

Some synchronous semiconductor memory devices accept a command clock which is buffered and a write clock which is unbuffered. Write command are synchronized to the command clock while the associated write data is synchronized to the write clock. Due to the use of the buffer, an arbitrary phase shift can exist between the command and write clocks. The presence of the phase shift between the two clocks makes it difficult to determine when a memory device should accept write data associated a write command. A synchronous memory device in accordance with the present invention utilizes the unbuffered strobe signal which is normally tristated during writes as a flag to mark the start of write data. A preamble signal may be asserted on the strobe signal line prior to asserting the flag signal in order to simplify flag detection.

79 Claims, 7 Drawing Sheets

SYNCHRONIZED WRITE DATA ON A HIGH SPEED MEMORY BUS

BACKGROUND OF THE INVENTION

1. Field of the Invention

The present invention relates generally to synchronous memory systems, and more particularly to synchronizing write data on a high speed memory bus.

2. Description of the Related Art

Figure 1:
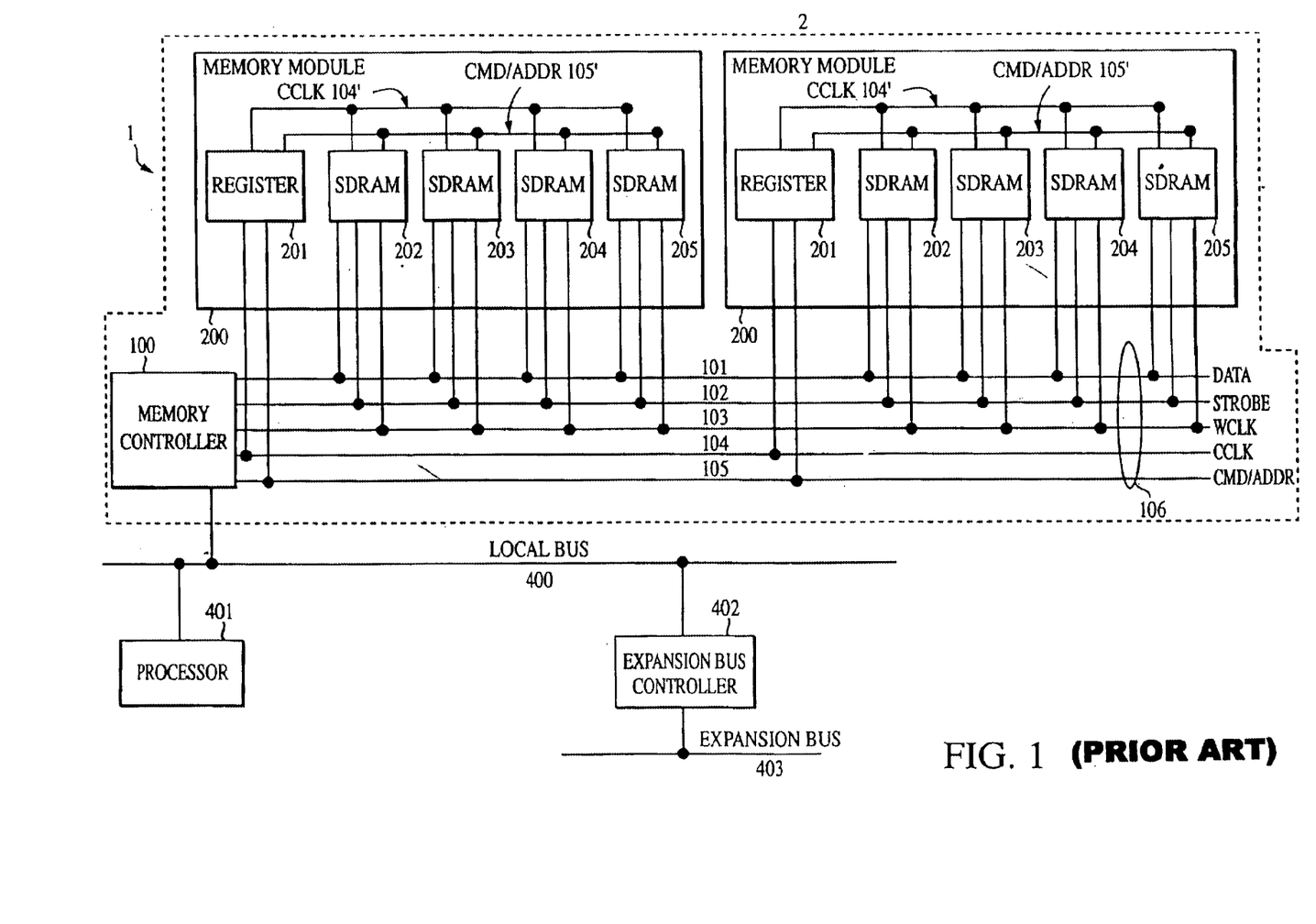
FIG. 1 illustrates a computer with a memory system including a memory controller, a plurality of memory modules, and a memory bus.

An exemplary computer system 1 is illustrated in FIG. 1. The computer system 1 includes a processor 401, a memory system 2, and a expansion bus controller 402. The memory system 2 and the expansion bus controller 402 are coupled to the processor 401 via a local bus 400. The expansion bus controller 402 is also coupled to one or more expansion buses 403, to which various peripheral devices such as mass storage devices, keyboard, mouse, graphics adapters, and multimedia adapters may be attached.

The memory system 2 includes a memory controller 100 which is connected to a plurality of memory modules 200 and 300 via a memory bus 106. The memory bus comprises a plurality of signal lines 101–105, which respectively communicate data DATA (over a plurality of lines 101), a data strobe STROBE, a write clock WCLK, a command clock CCLK, and commands and data CMD/DATA (over a plurality of lines 105). The memory modules 200 and 300 accept commands from the memory controller 100 synchronized on the rising edge of the command clock CCLK on signal line 104. A short time after the memory modules 200 and 300 accept a write command, the memory modules 200 and 300 accept write data synchronized on the rising and falling edges of the write clock WCLK. The number of write clock cycles which elapses between the synchronous semiconductor memory device accepting a write command and the time the synchronous semiconductor memory device begins accepting write data is known as write latency. During system initialization the memory controller and the memory modules are initialized to operate the memory system 2 with a desired write latency.

Figure 4:
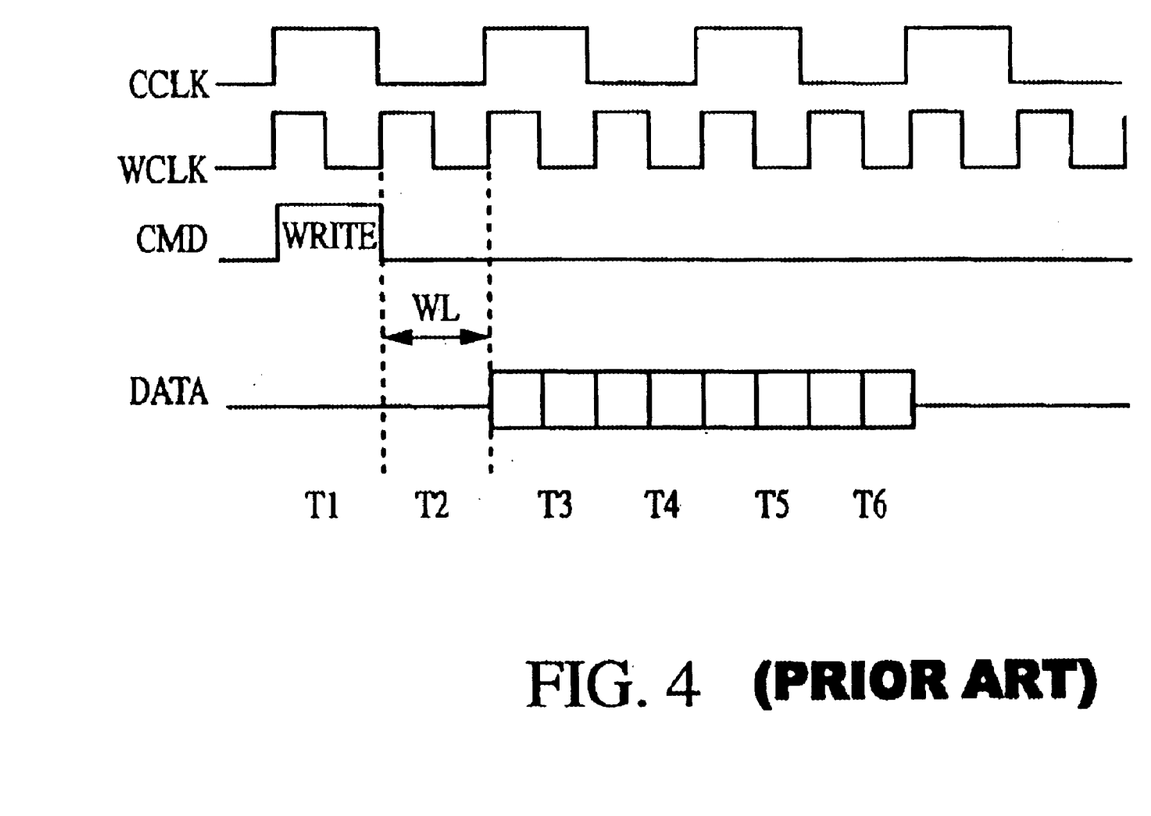
FIG. 4 is a timing diagram showing when the synchronous semiconductor memory device accepts write data when the command and write clocks are phase synchronized.

Each memory module 200 contains a register 201 and, in the example shown, a plurality of synchronous semiconductor memory devices 202–205. The timing diagram for a write operation to one of the synchronous semiconductor memory devices 202–205 is illustrated in FIG. 4. The write clock WCLK operates at double the frequency of the command clock CCLK. Both clocks are synchronized, so at the beginning of a clock cycle N of the command clock CCLK the write clock WCLK is beginning a corresponding 2N clock cycle. In FIG. 4, the exemplary memory is being operated with a write latency WL equal to 1 write clock cycle. Thus, when the write command is asserted on the command bus CMD on clock cycle T1, the system waits to satisfy the write latency WL requirement on clock cycle T2, and begins to accept write data on clock cycle T3. The synchronous semiconductor memory device operates in what is known as a burst mode, so it continues to accept write data over the next several clock cycles. In the illustrated example, the synchronous semiconductor memory device accepts an 8-length burst over 4 clock cycles T3–T6. Thus, if the command and write clocks are phase synchronized the synchronous semiconductor memory can count the number of write clock cycles which elapses after the device accepts a write command (synchronized with the command clock) to determine when it should being accepting write data.

Figure 2:
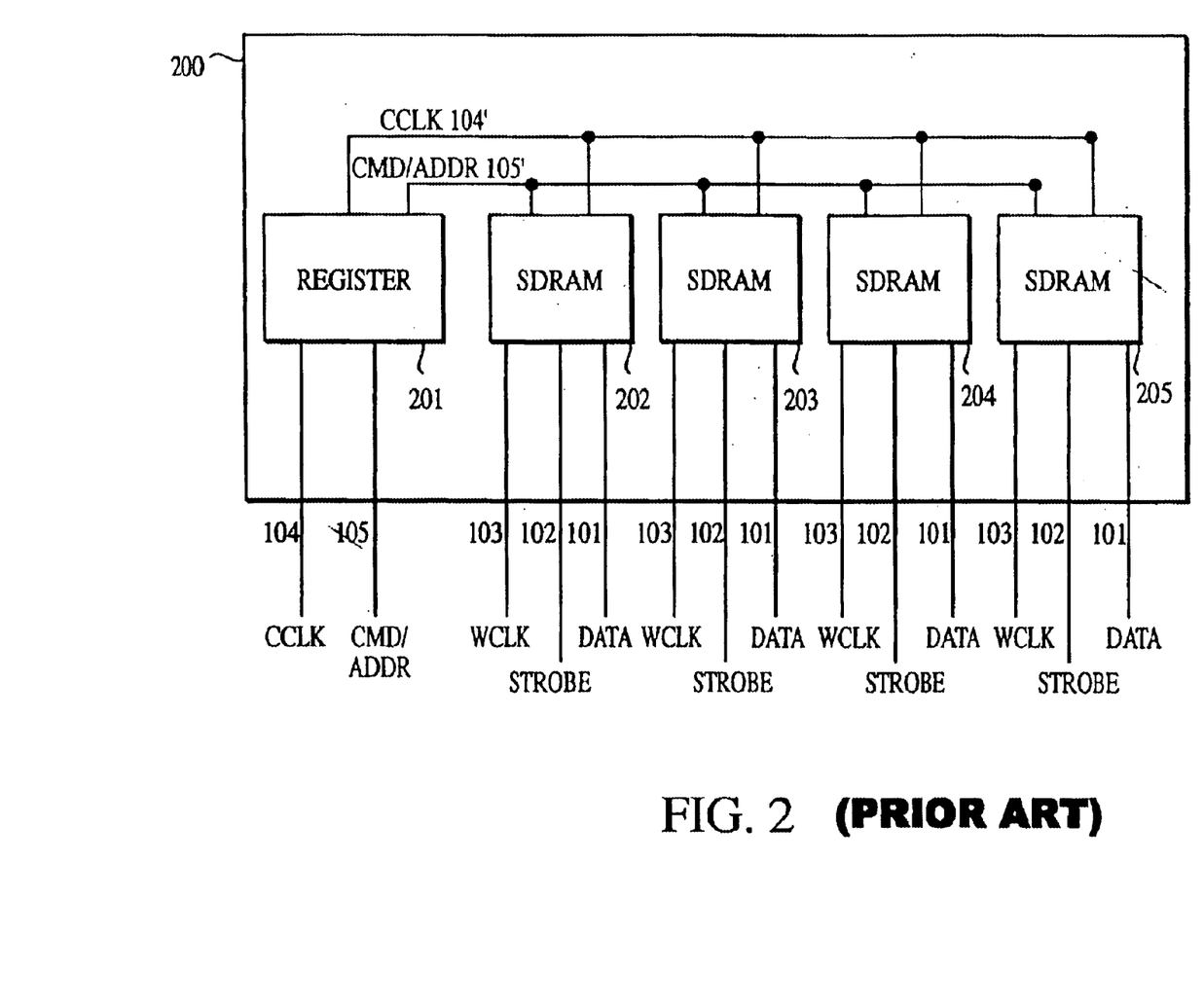
FIG. 2 is a more detailed illustration of a memory module from FIG. 1 including a register and a plurality of synchronous semiconductor memory devices.
Figure 5A:
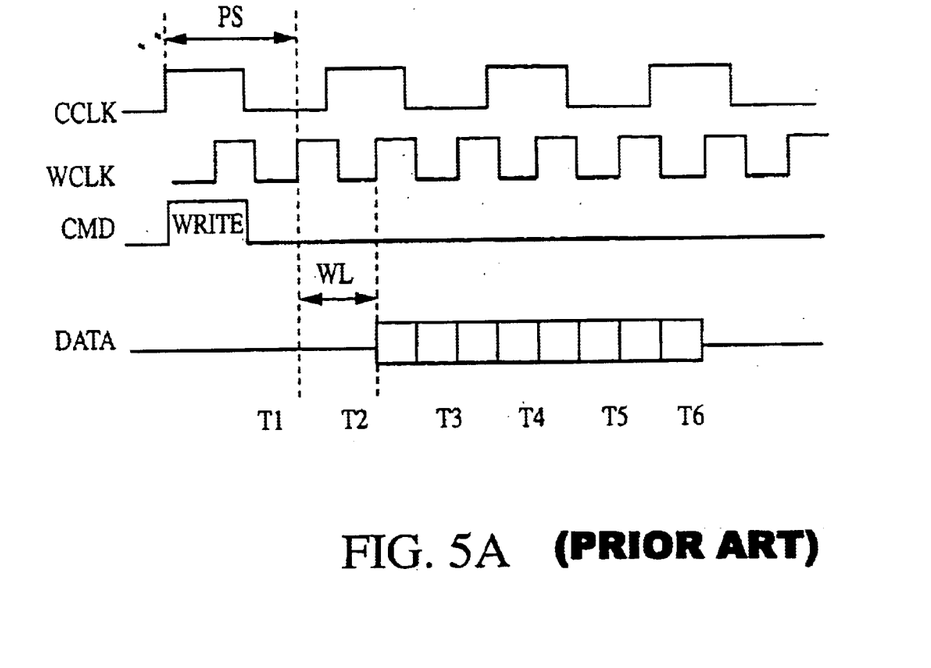
FIGS. 5A and 5B are timing diagrams showing when the synchronous semiconductor memory device should accept write data when there is a 1.5 write clock cycle and 0.5 write clock cycle, respectively, phase shift between the command and write clocks.
Figure 5B:
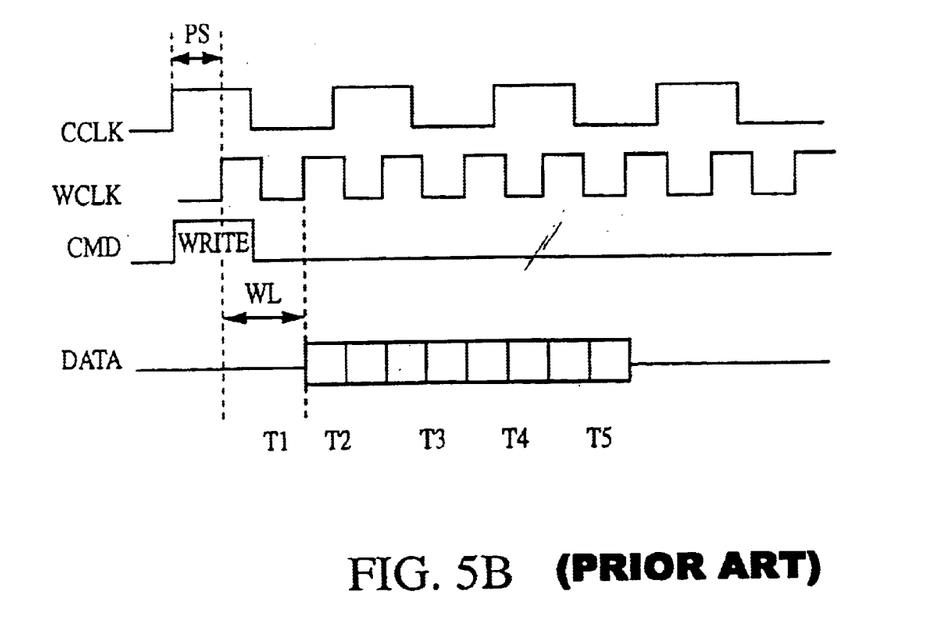

However, the command and write clocks may not be synchronized. Referring now to FIG. 2, a more detailed diagram of the memory module 200 from FIG. 1 is shown. The memory module 200 features a register 201 which is used to buffer the command clock CCLK and commands and addresses CMD/ADDR. The buffered command clock CCLK and commands and addresses CMD/ADDR are then distributed to each of the synchronous semiconductor memory devices 202–205 on internal signal lines 104' and 105' respectively. On the other hand, each of the synchronous semiconductor memory devices 202–205 have their data signal line 101, strobe signal line 102, and write clock signal line 103 directly coupled to the memory bus 106. Since the command clock CCLK signal is delayed by being buffered via register 201 while the write clock WCLK is directly coupled to the semiconductor memory devices 202–205, an arbitrary phase shift exists between the write and command clocks. For example, FIGS. 5A and 5B are timing diagrams for a write operation with a 1 write clock write latency WL. In FIGS. 5A and 5B the write and command clock wave forms appear identical. However, in FIG. 5A, the phase shift PS is 1.5 write clocks, therefore the synchronous semiconductor memory device should satisfy the write latency WL requirement on clock T2 and accept data on clocks T3–T6, while in FIG. 5B the phase shift PS is 0.5 write clocks, therefore the synchronous semiconductor memory device should satisfy the write latency WL requirement on clock T1 and accept write data on clocks T2–T5. Since the phase shift is induced by a device external to a synchronous semiconductor memory device, it is impossible for the synchronous semiconductor memory device to accurately determine the proper cycle of the write clock WCLK upon which to begin accepting write data.

Accordingly, there is a need for an apparatus and method to synchronize write data in memory systems employing separate command and write clocks which may incur a phase shift.

SUMMARY OF THE INVENTION

The present invention is directed at a method and apparatus for synchronizing write data in a synchronous semiconductor memory device and system which supports separate write and command clocks. The present invention permits the synchronous semiconductor memory device to accurately determine upon which write clock cycle it begins to accept write data, even if there is an arbitrary phase shift between the command and write clocks. The present invention takes advantage of the unbuffered data strobe signal which is normally unused during a write operation. The memory controller of the present invention transmits a write flag on the data strobe signal line on the write clock cycle upon which the synchronous semiconductor memory device should begin accepting write data. The synchronous semiconductor memory device of the present invention detects the write flag transmitted by the memory controller and begins accepting write data when it detects the write flag.

DETAILED DESCRIPTION OF EXEMPLARY EMBODIMENTS

Figure 3:
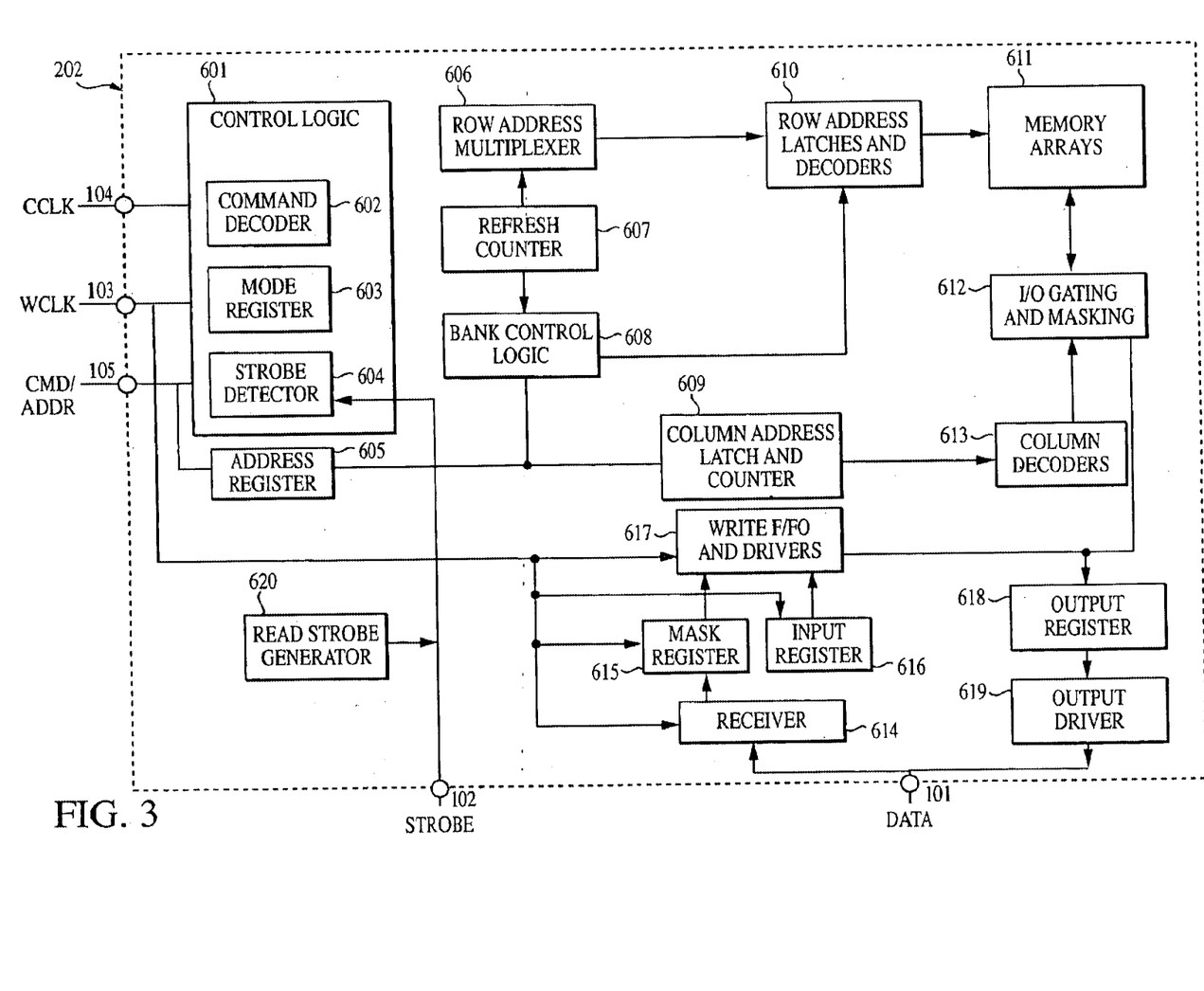
FIG. 3 is a more detailed illustration of a synchronous semiconductor memory device from the memory module of FIG. 2.

Now referring to the drawings, where like reference numerals designate like elements, there is shown in FIG. 3 a more detailed diagram of one synchronous semiconductor memory device, e.g., device 202 of FIG. 2. In the exemplary embodiment, the synchronous semiconductor memory device is a double data rate SDRAM with independent command and write clocks. A double data rate SDRAM is an SDRAM which accepts write data on both the rising and falling transitions of the write clock. Each rising or falling transition of the write clock cycle is known as a tick. The synchronous semiconductor memory device includes a variety of circuits used to control, address, and input/output data. For example, the synchronous semiconductor memory device includes a control logic 601 which accepts a command clock CCLK on signal line 104, a write clock WCLK on signal line 103, and commands and addresses CMD/ADDR on a plurality of signal lines 105. The control logic 601 includes a command decoder 602 for decoding received commands, and a register 603 for setting controlling certain operational parameters such as the write latency WL. The write latency is the number of write clock cycles which elapses between the time (synchronized with the command clock) the synchronous semiconductor memory devices accepts a write command and the time (synchronized with the write clock) the synchronous semiconductor memory device begins to accept write data. During system initialization, the memory controller 100 initializes the synchronous semiconductor memory device to operate at a specified write latency WL by writing an appropriate control value into a field of the register 603. Once initialized, the synchronous semiconductor memory device begins to accept write data with the specified write latency and the memory controller is responsible for providing write data to the synchronous semiconductor memory device at that time. The use of these features are conventional and further description is omitted for the sake of brevity.

The synchronous semiconductor memory device 202 also includes an address register 605 coupled to various conventional circuits used to address the memory arrays 611 of the synchronous semiconductor memory device. These circuits include the refresh counter 607, the row address multiplexer 606, the bank control logic 608, the row address latch and decoder 610, the column address latch and counter 609, and the column decoder 613. The synchronous semiconductor memory device also includes an input and output path which includes an I/O Gating and Masking Circuit 612, an output register 618, an output driver 619, a read strobe generator 620, a receiver 614, a mask register 615, an input register 616, and write FIFO and drivers 617. The read strobe generator 620 is used to generate a data strobe signal STROBE when the synchronous semiconductor memory device outputs read data. In a conventional synchronous semiconductor memory device, the data strobe signal STROBE is normally tristated when the device is not outputting read data. The use of these circuits are conventional and further description of their functions are omitted for the sake of brevity.

As previously explained and shown in FIG. 2, when a plurality of synchronous semiconductor memory devices 202–205 are assembled onto a memory module 200 which includes a register 201 that buffers the command clock CCLK but which directly couples the write clock WCLK, an arbitrary phase shift exists between the two clocks as seen by each of the synchronous semiconductor memory devices 202–205 even though the memory controller 100 transmits both clocks in a synchronized fashion. As a result of this, it is impossible for the synchronous semiconductor memory devices 202–205 to accurately determine which write clock WCLK cycle upon which to begin accepting write data.

The present invention solves this problem by employing a new use for the unbuffered data strobe signal STROBE. In a conventional synchronous semiconductor memory device, the data stobe signal STROBE is driven by the synchronous semiconductor memory device when it outputs read data and is tristated under all other circumstances. As shown in FIG. 3, the present invention adds a strobe detector circuit 604 to the control logic 601 of the synchronous semiconductor memory device 202. The strobe detector circuit 604 is connected to the data strobe signal line 102. The strobe detector circuit 604 is enabled after the synchronous semiconductor memory device receives a write command and is turned off after a write burst is completed.

Figure 6:
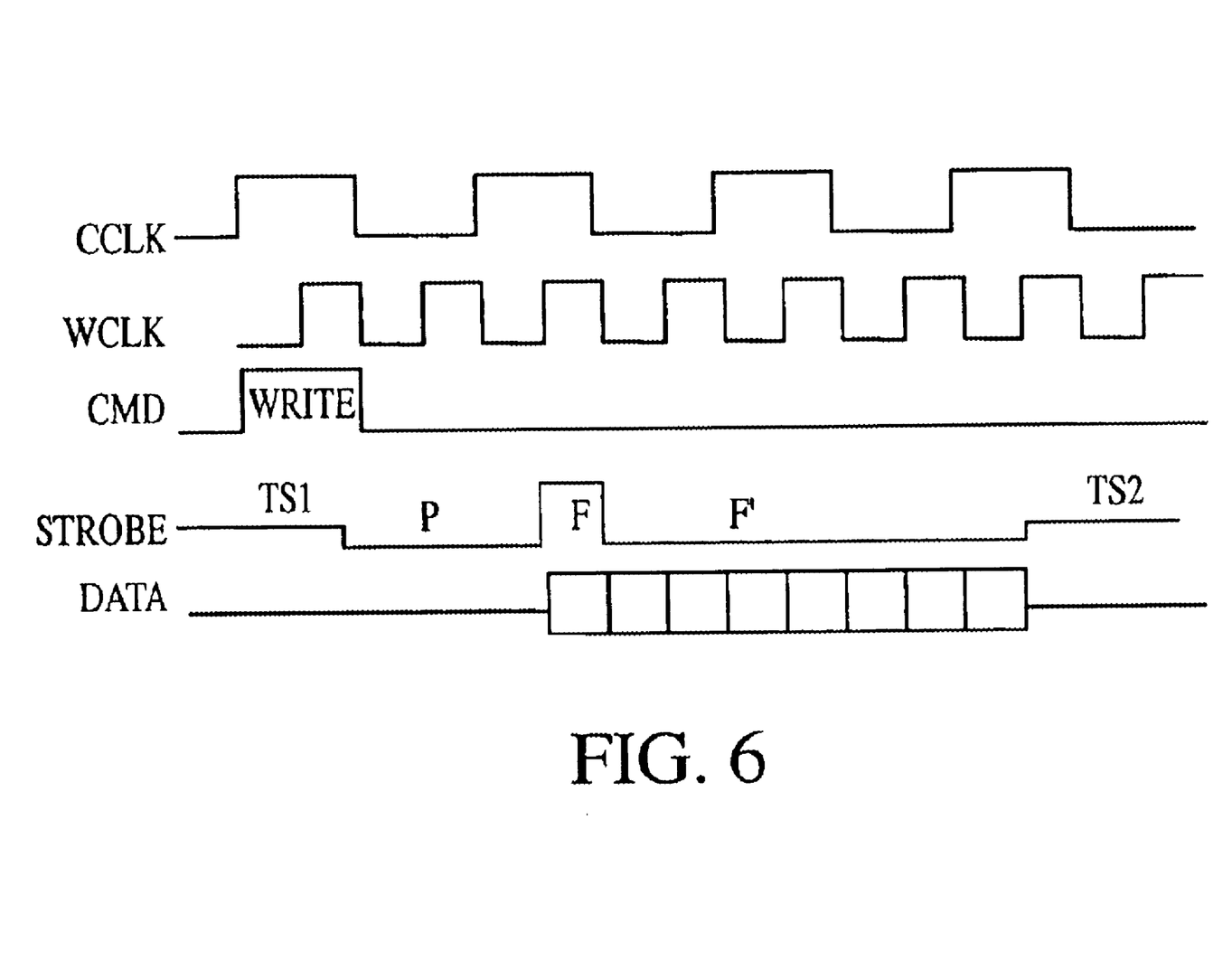
FIG. 6 is a timing diagram showing the use of a flag signal to mark the write clock cycle upon which the synchronous semiconductor memory device accepts write data.
Figure 7:
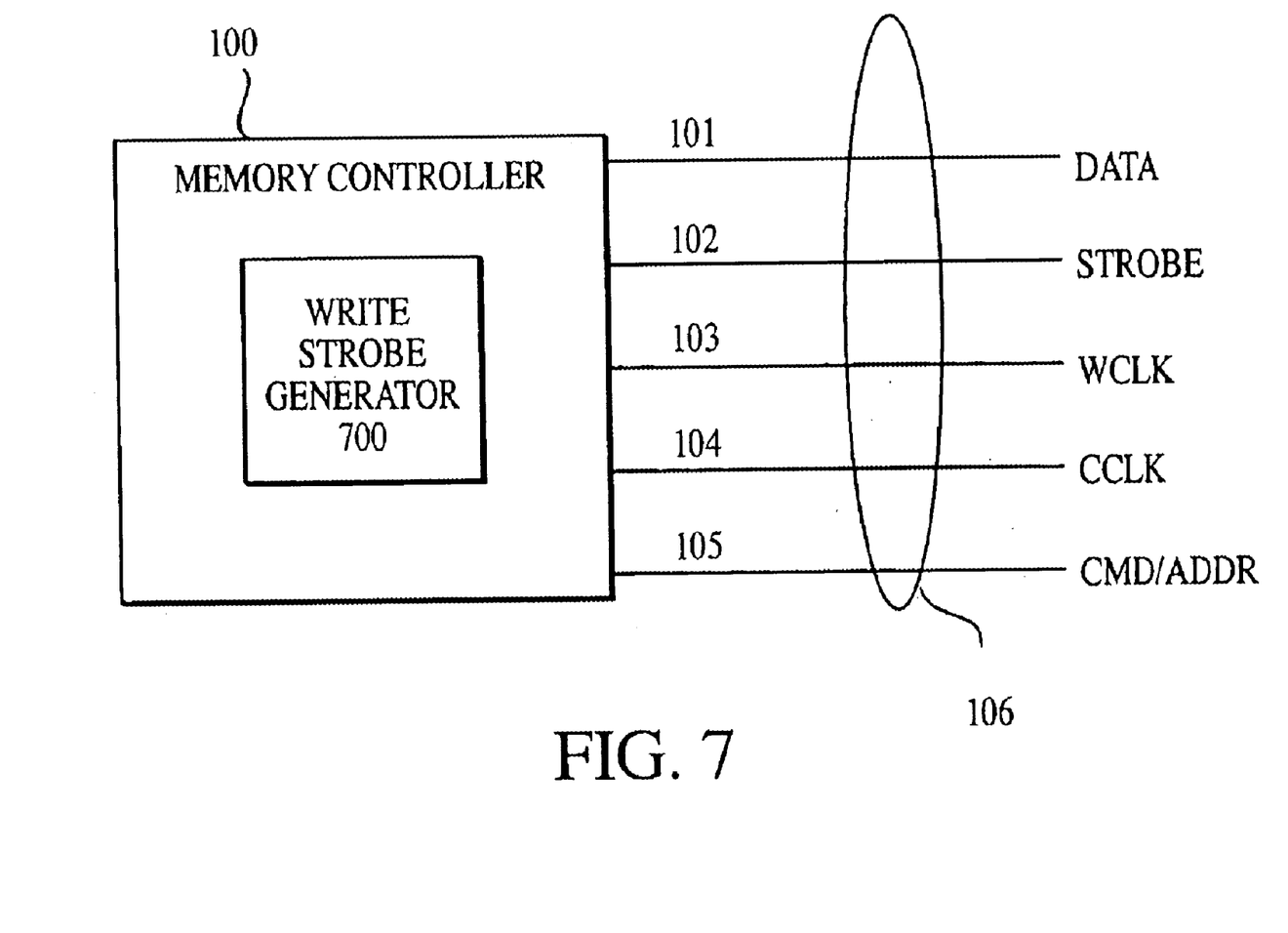
FIG. 7 is a block diagram of a memory controller according to the present invention.

As shown in FIG. 7, the memory controller 100 of the present invention includes a write strobe generator 700. During a write operation, the memory controller 100, through the use of the write strobe generator 700, drives the data strobe signal in a particular manner to mark the write clock cycle upon which the synchronous semiconductor memory device 202 should begin accepting write data. The manner in which the memory controller 100 drives the data strobe signal to mark the proper write cycle is shown in the timing diagram of FIG. 6. In the exemplary embodiment, the memory controller drives the data strobe signal STROBE to a logical high at a time coinciding with the start of write data and drives low the data strobe signal STROBE during the remainder of the write burst. The strobe detector circuit 604 detects the logical high of the data strobe signal STROBE and triggers the input write path (receiver 614, mask register 615, input register 616, and write FIFO and drivers 617) to accept write data.

More specifically, the memory controller 100 drives data strobe signal STROBE through four separate state changes. Initially, the data strobe signal STROBE is tristated. This region of the data strobe signal STROBE is indicated by TS1 in FIG. 6. The first state change is from the tristated condition to low logic level preamble signal P. The strobe detector circuit 604 is enabled and the strobe generator 620 is disabled when the synchronous semiconductor memory device receives a write command. If the strobe detector circuit 604 is enabled at a time when the strobe signal line is at a tristated condition, there is the possibility that the strobe detector circuit 604 may falsely detect a logical high state of the data strobe signal STROBE. False detection can be prevented by driving the data strobe signal to a logical low when the strobe detector circuit 604 is enabled. This is accomplished by the use of a preamble portion P of the data strobe signal STROBE, which is a logical low signal. The amount of time which the strobe signal needs to be driven low for a reliable detection of the transition to a logical high is dependent upon the speed of the strobe detector 604. In the exemplary embodiment, the preamble portion is maintained for 1.5 cycles (i.e., 3 ticks) of the write clock. In an alternate embodiment, the preamble portion is maintained for 1 cycle (i.e., 2 ticks) of the write clock. In yet another alternate embodiment the preamble may be dispensed with entirely.

The second state change is from the preamble signal P to a flag F which marks the beginning of write data. The flag F is communicated to the synchronous semiconductor memory device when the memory controller 100 drives the data strobe signal STROBE to a logical high for one tick (i.e., half a cycle) of the write clock WCLK. Upon receiving the flag signal, the synchronous semiconductor memory device begins accepting write data, which it buffers in the write FIFO and drivers circuit 617. This data will be combined with the data from the remainder of the write burst and written to the memory array 611 at the end of the write burst.

The third state change is the deassertion of the write flag F. For the remainder of the write burst, which is 7 ticks in the exemplary embodiment, the synchronous semiconductor memory device continues to accept write data. During this time, the memory controller 100 drives the data strobe signal STROBE low, as indicated by the region marked as F'. As additional write data arrives, the synchronous semiconductor memory device buffers the data in the write FIFO and drivers circuit 617.

The final state change is a return to the tristated condition. Once the memory controller has completed transmission of the data associated with the write burst, the synchronous semiconductor memory device should no longer accept data. The memory controller signifies this condition by tristating the data strobe signal STROBE, as indicated by the region marked TS2 in the figure. This causes the synchronous semiconductor memory device to stop accepting write data. Additionally, the synchronous semiconductor memory device also writes the data which had been buffered in the write FIFO and driver circuit 617 to the memory arrays 611, thereby completing the write operation.

As previously discussed, the use of the preamble P is designed to prevent a false detection of the flag since the data strobe signal STROBE is ordinarily tristated absent the output of read data. The length of time the preamble needs to be maintained to ensure reliable detection of the flag signal is dependent upon the speed of the strobe detector circuit 604 and impacts the minimum amount of time which must elapse between a read command and a write command.

In order to improve the speed of the memory device when a write command follows a read command, it would be desirable not to have a preamble signal P, or to minimize its effect. Accordingly, the invention further encompasses two alternate embodiments which eliminates the potential impact the preamble P would have on a write command which follows a read command. The first alternate embodiment takes advantage of the fact that the phase shift between the write and command clocks, while arbitrary, remains constant. Thus, the use of the flag signal on the data strobe signal line for the purpose of synchronizing write data need only be performed only during the initialization of the memory system if the synchronous semiconductor memory device can be taught the timing relationship between the command and write clocks. For example, the initialization process can include a dummy write during which the memory controller 100 transmits the preamble and the flag. The control logic 601 is modified to observe which write clock edge (relative to the command clock edge in which the WRITE command is accepted) corresponds to the one upon which it begins accepting write data. In this manner, the memory controller 200 uses the preamble and flag signals on the STROBE signal line to teach the control logic 601 the phase difference between the command and write clocks. This phase difference can be expressed as the number of write clock cycles which elapses between the time the WRITE command is accepted and the time the memory device begins accepting data, and can be stored, for example, in a register of the memory device, such as a field of the memory device's mode register. During normal operation the control logic 601 can use the stored timing difference to determine when the synchronous semiconductor memory device 202 should accept write data. This eliminates the need to transmit the preamble and flag signals over the data strobe signal line during normal operation of the synchronous semiconductor memory device, thereby improving the performance of a the memory device when servicing a write which follows a read.

In the second alternate embodiment the flag is transmitted on the data strobe signal on each write transaction, but the preamble signal is eliminated. The false detection issue which required the use of the preamble signal can be managed if the false detection is discovered before any data buffered after the false detection is written to the memory arrays 611. More specifically, prior to the synchronous semiconductor memory device accepting the WRITE command, the control logic 601 disables the strobe detector 604 and places the write circuit path (receiver 614, mask register 615, input register 616, write FIFO and drivers 617) in a reset condition to prevent the write circuit path from accepting and buffering data. When the WRITE command is accepted, the control logic 601 enables the strobe detector 604 and negates the reset signal, which is a momentary signal, thereby permitting the write circuit path to accept and buffer data under the control of the strobe detector 604. If the memory controller does not use a preamble signal, the strobe detector 604 may falsely detect the tristated condition of the data strobe signal line STROBE as a logical high and cause the write circuit path to begin accepting and buffering data. However, a false detection of the flag will not be followed by seven consecutive logical lows on the data strobe signal line STROBE because the memory controller 100 will send a true flag within seven ticks of asserting the WRITE command. Therefore, the strobe detector 604 can be modified to send the reset signal to the write circuit path if it does not count seven consecutive logical lows after it has detected a logical high on the data strobe signal line STROBE. The momentary reset signal will cause the write circuit path to discard any buffered data and begin data capture upon receipt of the correct flag, which prevents incorrect data from being written to the memory arrays 611. The strobe detector 604 is disabled after it has detected seven consecutive logical lows on the data strobe signal line STROBE, in order to prevent it from falsely detecting the second tristated condition (i.e., signal state TS2) as a flag. The second alternate embodiment can also optionally lock out the reset feature after it has detected less than seven consecutive logical lows. It may be desirable to prevent the data strobe detector 604 from issuing a reset signal (or alternatively, to prevent the write circuit path from responding to a reset signal) after it has detected, for example, five or six consecutive logical lows on the data strobe signal line STROBE following a logical high. This is to prevent the strobe detector signal 604 from issuing a reset if it falsely detects the second tristated condition (i.e., signal state TS2) as a flag.

While certain embodiments of the invention have been described and illustrated above, the invention is not limited to these specific embodiments as numerous modifications, changes and substitutions of equivalent elements can be made without departing from the spirit and scope of the invention. Accordingly, the scope of the present invention is not to be considered as limited by the specifics of the particular structures which have been described and illustrated, but is only limited by the scope of the appended claims.

What is claimed as new and desired to be protected by Letters Patent of the United States is:

1. A memory device comprising:
   a write clock input path for receiving a write clock signal;
   a command signal path for receiving a write command;
   at least one data signal path for receiving write data;
   a data strobe signal path for receiving a write strobe signal which includes a first strobe portion; and a logic circuit responsive to a write command on said command signal path and said first strobe portion of said write strobe signal for clocking in data received on said data signal path using a write clock signal received on said write clock input path, wherein said data strobe signal path is also used by said memory device to send a read strobe signal to a memory controller during a memory read operation.

2. A memory device as in claim 1 wherein said first strobe portion is a first predetermined logic level of said write strobe signal.

3. A memory device as in claim 2 wherein said write strobe signal has a preamble prior to said first strobe portion, said preamble setting the data strobe signal path to a second predetermined logic level different from said first predetermined logic level.

4. A memory device as in claim 2 wherein said first strobe portion remains at said first predetermined logic level for a period of time which is equal to one clock tick of said write clock signal.

5. A memory device as in claim 4 wherein said write strobe signal includes a second portion following said first strobe portion, said second portion being at a second predetermined logic level for the duration of the clocking of write data into said memory device.

6. A memory device as in claim 5 wherein said write strobe signal has a preamble prior to said first strobe portion, said preamble being at second predetermined logic level.

7. A memory device as in claim 6 wherein said preamble lasts for a predetermined number of ticks of said write clock signal.

8. A memory device as in claim 7 wherein said preamble lasts for two ticks of said write clock signal.

9. A memory device as in claim 7 wherein said preamble lasts for three ticks of said write clock signal.

10. A memory device as in claim 6 wherein said first predetermined logic level is a high logic level and said second predetermined logic level is a low logic level.

11. A memory device as in claim 6 wherein said write strobe signal is a tri-state signal.

12. A memory device as in claim 5 wherein said logic circuit causes said memory device to clock in write data in data bursts having a predetermined number of bits, said first strobe portion of said write strobe signal being coincided with the reception of a first bit of a data burst, said second portion of said write strobe signal being coincident with the remaining bits of said data burst.

13. The memory device of claim 1, wherein said memory device is a synchronous dynamic random access memory.

14. A memory module comprising:
at least one memory device, said memory device comprising:
a write clock input path for receiving a write clock signal;
a command signal path for receiving a write command;
at least one data signal path for receiving write data;
a data strobe signal path for receiving a write strobe signal which includes a first strobe portion, wherein said data strobe signal path is also used by said memory device to send a read strobe signal to a memory controller during a memory read operation;
a logic circuit responsive to a write command on said command signal path and said first strobe portion of said write strobe signal for clocking in data received on said data signal path using a write clock signal received on said write clock input path; and
a connector for electrically connecting said module to a signal bus.

15. A module as in claim 14 wherein said first strobe portion is a first predetermined logic level of said write strobe signal.

16. A module as in claim 15 wherein said write strobe signal has a preamble prior to said first strobe portion, said preamble setting the data strobe signal path to a second predetermined logic level different from said first predetermined logic level.

17. A module as in claim 15 wherein said first strobe portion remains at said first predetermined logic level for a period of time which is equal to one clock tick of said write clock signal.

18. A module as in claim 17 wherein said write strobe signal includes a second portion following said first strobe portion, said second portion being at a second predetermined logic level for the duration of the clocking of write data into said memory device.

19. A module as in claim 18 wherein said write strobe signal has a preamble prior to said first strobe portion, said preamble being at second predetermined logic level.

20. A module as in claim 19 wherein said preamble lasts for a predetermined number of ticks of said write clock signal.

21. A module as in claim 20 wherein said preamble lasts for two ticks of said write clock signal.

22. A module as in claim 20 wherein said preamble lasts for three ticks of said write clock signal.

23. A module as in claim 19 wherein said first predetermined logic level is a high logic level and said second predetermined logic level is a low logic level.

24. A module as in claim 19 wherein said write strobe signal is a tri-state signal.

25. A module as in claim 18 wherein said logic circuit causes said memory device to clock in write data in data bursts having a predetermined number of bits, said first strobe portion of said write strobe signal being coincided with the reception of a first bit of a data burst, said second portion of said write strobe signal being coincident with the remaining bits of said data burst.

26. The memory module of claim 14, wherein said at least one memory device is a synchronous dynamic random access memory.

27. A processor system comprising;
a processor; and
a memory device coupled to said processor, said memory device comprising:
a write clock input path for receiving a write clock signal;
a command signal path for receiving a write command;
at least one data signal path for receiving write data;
a data strobe signal path for receiving a write strobe signal which includes a first strobe portion, wherein said data strobe signal path is also used by said memory device to send a read strobe signal to a memory controller during a memory read operation; and
a logic circuit responsive to a write command on said command signal path and said first strobe portion of said write strobe signal for clocking in data received on said data signal path using a write clock signal received on said write clock input path.

28. A processor system as in claim 27 wherein said first strobe portion is a first predetermined logic level of said write strobe signal.

29. A processor system as in claim 28 wherein said write strobe signal has a preamble prior to said first strobe portion, said preamble setting the data strobe signal path to a second predetermined logic level different from said first predetermined logic level.

30. A processor system as in claim 28 wherein said first strobe portion remains at said first predetermined logic level for a period of time which is equal to one clock tick of said write clock signal.

31. A processor system as in claim 30 wherein said write strobe signal includes a second portion following said first strobe portion, said second portion being at a second predetermined logic level for the duration of the clocking of write data into said memory device.

32. A processor system as in claim 31 wherein said write strobe signal has a preamble prior to said first strobe portion, said preamble being at second predetermined logic level.

33. A processor system as in claim 32 wherein said preamble lasts for a predetermined number of ticks of said write clock signal.

34. A processor system as in claim 33 wherein said preamble lasts for two ticks of said write clock signal.

35. A processor system as in claim 33 wherein said preamble lasts for three ticks of said write clock signal.

36. A processor system as in claim 32 wherein said first predetermined logic level is a high logic level and said second predetermined logic level is a low logic level.

37. A processor system as in claim 32 wherein said write strobe signal is a tri-state signal.

38. A processor system as in claim 31 wherein said logic circuit causes said memory device to clock in write data in data bursts having a predetermined number of bits, said first strobe portion of said write strobe signal being coincided with the reception of a first bit of a data burst, said second portion of said write strobe signal being coincident with the remaining bits of said data burst.

39. The processor system of claim 27, wherein said memory device is a synchronous dynamic random access memory.

40. A memory device comprising:
a write clock input path for receiving a write clock signal;
a command signal path for receiving a write command;
at least one data signal path for receiving write data;
a data strobe signal path coupled to a strobe detector which senses a logical state of the data strobe signal path, said data strobe signal path having a first logical state corresponding to a first strobe portion and a second logical state corresponding to a second strobe portion;
a logic circuit responsive to the write command and the strobe detector detecting the first logical state to start clocking in write data into a buffer using said write clock signal;
wherein said logic circuit is responsive to the strobe detector detecting the second logical state to continue to clock in write data into the buffer and to count ticks of the write clock while the strobe detector detects the second logical state; and
wherein said logic circuit is responsive to the strobe detector detecting the strobe signal at the first logical state to reset the buffer to discard previously clocked in data if the count is less than a first predetermined number.

41. The memory device of claim 40, wherein said logic circuit is responsive to the count reaching a second predetermined number to prevent the resetting of the buffer.

42. The memory device of claim 41, wherein said first predetermined number is equal one tick less than the write burst length of said memory device.

43. The memory device of claim 41, wherein the write burst length of said memory device is 8 ticks and the first predetermined number is 7 ticks.

44. The memory device of claim 41, wherein said second predetermined number is equal to two ticks less than the write burst length of said memory device.

45. The memory device of claim 41, wherein said second predetermined number is equal to three ticks less than the write burst length of said memory device.

46. The memory device of claim 41, wherein the write burst length of said memory device is 8 ticks and said second predetermined number is 6 ticks.

47. The memory device of claim 41, wherein the write burst length of said memory device is 8 ticks and said second predetermined number is 5 ticks.

48. A memory module comprising:
a first command signal path for receiving a command;
a first command clock signal path for receiving a command clock;
a register coupled to the first command signal path and the first command clock signal path, wherein said register outputs the command received on the first command signal path to a second command signal path and outputs the command clock received on the first command clock signal path to a second command clock signal path;
a write clock input path for receiving a write clock signal;
a data signal path for receiving write data;
a data strobe signal path for receiving a write strobe signal which includes a first portion; and
at least one memory device, said memory device coupled to the second command signal path, the second command clock path, the write clock input path, the data signal path, and the data strobe signal path,
wherein each of said memory device further comprises a logic circuit responsive to a write command on said second command signal path and said first strobe portion of said write strobe signal on said data strobe signal path for clocking in data received on said data signal path using a write clock signal received on said write clock input path.

49. A method of operating a memory device, said method comprising:
receiving a write clock signal;
receiving a write command;
receiving a write strobe signal which has a first strobe portion associated with a clocking edge of said write clock signal, wherein said write strobe signal is received on a data strobe signal path of said memory device which is also used by said memory device to send a read strobe signal to the memory controller during a memory read operation; and
clocking in write data using said write clock signal after receipt of said write command and beginning with the clocking edge associated with said first strobe portion.

50. A method as in claim 49 wherein said write strobe signal has a preamble prior to said first strobe portion.

51. A method as in claim 49 wherein said write strobe signal has no preamble prior to said first strobe portion.

52. A method as in claim 49 wherein said first strobe portion is a first predetermined logic level of said write strobe signal.

53. A method as in claim 52 wherein said first strobe portion remains at said first predetermined logic level for a period of time which is equal to one clock tick of said write clock signal.

54. A method as in claim 53 wherein said write strobe signal includes a second portion following said first strobe portion, said second portion being at a second predetermined logic level for the duration of the clocking of write data into said memory device.

55. A method as in claim 54 wherein said write strobe signal has a preamble prior to said first strobe portion, said preamble being at second predetermined logic level.

56. A method as in claim 55 wherein said preamble lasts for a predetermined number of ticks of said write clock signal.

57. A method as in claim 56 wherein said preamble lasts for two ticks of said write clock signal.

58. A method as in claim 56 wherein said preamble lasts for three ticks of said write clock signal.

59. A method as in claim 55 wherein said first predetermined logic level is a high logic level and said second predetermined logic level is a low logic level.

60. A method as in claim 55 wherein said write strobe signal is a tri-state signal.

61. A method as in claim 54 wherein said memory device clocks in write data in data bursts having a predetermined number of bits, said first strobe portion of said write strobe signal being coincided with the reception of a first bit of a data burst, said second portion of said write strobe signal being coincident with the remaining bits of said data burst.

62. The method of claim 49, wherein said memory device is a synchronous dynamic random access memory.

63. A method as in claim 49 wherein said write command and write strobe signal are received from a memory controller.

64. A method of operating a memory device, said method comprising:
 initializing the memory device, said initializing further comprising:
  receiving a command clock signal;
  accepting a first write command in synchronism with a clock edge of the command clock signal;
  receiving a write clock signal;
  receiving a write strobe signal which has a first strobe portion associated with a clocking edge of said write clock signal, wherein said write strobe signal is received on a data strobe signal path of said memory device which is also used by said memory device to send a read strobe signal to the memory controller during a memory read operation;
  counting a number of write clock signals between the acceptance of the first write command and the first strobe portion of the write strobe signal.

65. A method as in claim 64, wherein said step of initializing further comprises:
 storing the number in a register of the memory device.

66. A method as in claim 65, wherein said register is a mode register of the memory device.

67. A method as in claim 64, further comprising the step of:
 operating the memory device, said operating further comprising:
  accepting a second write command in synchronism with a clocking edge of the write clock signal;
  clocking in write data using said write clock signal after the counted number of write clock signals has elapsed.

68. A method as in claim 65, further comprising the step of:
 operating the memory device, said operating further comprising:
  accepting a second write command in synchronism with a clocking edge of the write clock signal;
  clocking in write data using said write clock signal after the counted number of write clock signals has elapsed.

69. The method of claim 64, wherein said memory device is a synchronous dynamic random access memory.

70. A method of operating a memory device, said method comprising:
 receiving a write clock signal;
 receiving a write command and enabling a strobe detector, said strobe detector sensing a write strobe signal line which has a first logical state corresponding to a first portion of a strobe signal associated with a clocking edge of said write clock signal and a second logical state corresponding to a second portion of the write strobe signal;
 when the strobe detector senses the strobe signal at the first logical state, starting to clock in write data into a buffer using the write clock signal on the clocking edge associated with said first strobe portion;
 when the strobe detector sense the strobe signal at the second logical state, continuing to clock in write data using said write clock and counting the ticks of the write clock signal while the strobe signal is sensed at the second logical state; and
 when the strobe detector sense the strobe signal at the first logical state, resetting the buffer to discard previously clocked in data if the counting is less than a first predetermined number.

71. The method of claim 70, further comprising the step of:
 when the counting has reached a second predetermined number, preventing the buffer from being reset.

72. The method of claim 70, wherein said first predetermined number is equal to one tick less than the write burst length of said memory device.

73. The method of claim 70, wherein the write burst length of said memory device is 8 ticks and the first predetermined number is 7 ticks.

74. The method of claim 71, wherein said second predetermined number is equal to two ticks less than the write burst length of said memory device.

75. The method of claim 71, wherein said second predetermined number is equal to three ticks less than the write burst length of said memory device.

76. The method of claim 71, wherein the write burst length of said memory device is 8 ticks and said second predetermined number is 6 ticks.

77. The method of claim 71, wherein the write burst length of said memory device is 8 ticks and said second predetermined number is 5 ticks.

78. The method of claim 70, wherein said memory device is a synchronous dynamic random access memory.

79. The memory device of claim 40, wherein said memory device is a synchronous dynamic random access memory.

* * * * *

UNITED STATES PATENT AND TRADEMARK OFFICE
CERTIFICATE OF CORRECTION

PATENT NO. : 6,807,613 B1
DATED : October 19, 2004
INVENTOR(S) : Brent Keeth et al.

It is certified that error appears in the above-identified patent and that said Letters Patent is hereby corrected as shown below:

Column 12,
Lines 20 and 25, "sense" should read -- senses --.

Signed and Sealed this

Fifteenth Day of March, 2005

JON W. DUDAS
*Director of the United States Patent and Trademark Office*